(12) United States Patent
Nishikawa

(10) Patent No.: US 7,563,650 B2
(45) Date of Patent: Jul. 21, 2009

(54) CIRCUIT BOARD AND THE MANUFACTURING METHOD

(75) Inventor: Kazuhiro Nishikawa, Osaka (JP)

(73) Assignee: Panasonic Corporation, Osaka (JP)

( * ) Notice: Subject to any disclaimer, the term of this patent is extended or adjusted under 35 U.S.C. 154(b) by 713 days.

(21) Appl. No.: 10/548,457

(22) PCT Filed: Apr. 1, 2004

(86) PCT No.: PCT/JP2004/004756

§ 371 (c)(1),
(2), (4) Date: Sep. 12, 2005

(87) PCT Pub. No.: WO2004/091266

PCT Pub. Date: Oct. 21, 2004

(65) Prior Publication Data

US 2006/0216854 A1 Sep. 28, 2006

(30) Foreign Application Priority Data

Apr. 2, 2003 (JP) .............................. 2003-099084

(51) Int. Cl.
*H01L 21/00* (2006.01)
*H01L 23/29* (2006.01)
(52) U.S. Cl. ............... 438/125; 257/784; 257/E21.512; 257/E23.178
(58) Field of Classification Search .......... 438/125, 438/106; 257/784, E21.512, E23.178; 361/764, 361/761; 29/848
See application file for complete search history.

(56) References Cited

FOREIGN PATENT DOCUMENTS

| JP | 4-283987 | 10/1992 |
|---|---|---|
| JP | 9-139560 | 5/1997 |
| JP | 2000-307216 | 11/2000 |
| JP | 2001-057408 | 2/2001 |
| JP | 2002-204049 | 7/2002 |
| JP | 2002-261421 | 9/2002 |
| JP | 2002-288620 | 10/2002 |
| JP | 2002-374052 | 12/2002 |
| JP | 2003-092460 | 3/2003 |

*Primary Examiner*—Davienne Monbleau
*Assistant Examiner*—Monica D Harrison
(74) *Attorney, Agent, or Firm*—Wenderoth, Lind & Ponack, L.L.P.

(57) ABSTRACT

A method for manufacturing a circuit board (7); in which, an electronic component is injected into a resin substrate at a low temperature, and then the resin substrate is improved in its heat withstanding property. The manufacturing method comprises the steps of softening by heat a resin substrate which contains a thermoplastic component and a chemical cross-link component and then injecting an electronic component (1) into the resin substrate; curing the resin substrate by bridging the chemical cross-link component of the resin substrate, making the resin substrate into a heat-withstanding substrate (70); and forming an electric wiring pattern (6) on the heat-withstanding substrate (70) for connection with a protruding electrode (2) of the electronic component (1). The circuit board (7) maintains the high dimensional accuracy throughout the manufacturing process. Thus, the present invention offers a superior circuit board, which is thin and compact in size and has a small thermal deformation rate.

16 Claims, 7 Drawing Sheets

CIRCUIT BOARD AND THE MANUFACTURING METHOD

TECHNICAL FIELD

The present invention relates to a circuit board having an electronic component injected into the resin substrate, and a method for manufacturing the circuit board.

BACKGROUND ART

A growing number of sophisticated portable telephone units, portable intelligent terminals and the like communication apparatus are being developed. These portable apparatus are requested to be compact in size, light in weight and slim in the overall profile. A wiring board used in such apparatus has been mounted with semiconductor chips, resistors, capacitors, sensors and the like electronic components on its both surfaces. In addition to the basic function expected for the wiring boards, some of the advanced circuit boards contain such circuit components within the inside of the board for better serve the concurrent trends in the apparatus pursuing more compactness and slimness.

Japanese Patent Unexamined Publication No. 2002-261421, for example, discloses a method of incorporating an electronic component within the substrate of a circuit board. FIG. 6A through FIG. 6D are cross sectional views used to describe the manufacturing method. First, as FIG. 6A shows, semiconductor chip 21 and electronic component 23 are placed at their specified locations on the main surface of resin substrate 24, which is made of a thermoplastic resin material. Semiconductor chip 21 is of course among the electronic components, but the semiconductor chip and the electronic component are treated as separate items in the present description. In this conventional example, semiconductor chip 21 is disposed on resin substrate 24 so that the bump electrodes 22 of semiconductor chip 21 face to the main surface of resin substrate.

Then, as FIG. 6B shows, resin substrate 24 mounted with semiconductor chip 21 and electronic component 23 is loaded on a heat-pressing equipment equipped with a pair of heat press plates 25 and 26. Resin substrate 24 is heated by lower heat press plate 26, to have it softened. When upper heat press plate 25 is lowered, semiconductor chip 21 and electronic component 23 are injected into resin substrate 24. The pair of heat press plates 25, 26 is cooled to have resin substrate 24 cured. Thus resin substrate 24 as illustrated in FIG. 6C is provided; wherein, semiconductor chip 21 and electronic component 23 are injected into and embedded.

Next, as FIG. 6D shows, electrical wiring patterns 27 are formed to include semiconductor chip 21's bump electrode 22 and electronic component 23's electrode terminal 231 by, for example, applying a conductor paste using a screen-printing process and hardening it. This completes a finished circuit board; where, semiconductor chip 21 and electronic component 23 are injected into resin substrate 24 and connected by electrical wiring patterns 27 of a certain specific pattern.

As to a material for resin substrate 24, polyethylene terephthalate (PET) or the like polyester material, polyolefin, vinyl chloride, polycarbonate, acrylonitril butadiene styrene, etc. may be used. In a case where polyethylene terephthalate (PET) resin is used for the substrate, semiconductor chip 21 and electronic component 23 can be injected into resin substrate 24 at an approximate temperature 160° C., pressure 400N.

Japanese Patent Unexamined Publication No. 2001-57408 teaches a method which uses a provisional substrate in injecting a semiconductor chip in resin substrate. FIG. 7A through FIG. 7E are cross sectional views used to describe the important process steps of the manufacturing method.

In the first place, as FIG. 7A shows, electrical wiring patterns 27 are formed on the main surface of provisional substrate 28 by, for example, screen-printing a conductor paste and hardening it. Then, as FIG. 7B shows, the bump electrodes 22 of semiconductor chip 21 are connected to electrical wiring patterns 27 by means of a generally practiced connecting method.

As FIG. 7C shows, resin substrate 29 of a thermoplastic resin is pressed onto provisional substrate 28 so that semiconductor chip 21 is involved into the resin substrate. In practice, provisional substrate 28 mounted with semiconductor chip 21 and resin substrate 29 are overlaid together and placed between a pair of heat press plates for a press-heating treatment.

At this stage, as FIG. 7D shows, heat sink 30 is provided at the reverse surface of resin substrate 29. Heat sink 30 may be disposed to be sticking on the surface of resin substrate 29 by heating at least either one of resin substrate 29 and heat sink 30, while keeping provisional substrate 28 as it is. And then, provisional substrate 28 is removed to complete a finished circuit board as shown in FIG. 7E; where, both semiconductor chip 21 and electrical wiring patterns 27 have been injected into resin substrate 29. Since the entire items including electrical wiring patterns 27 are injected and embedded within resin substrate 29, the finished circuit board thus manufactured is thinner as compared to those provided through other methods. Furthermore, the above-configured circuit board can be stacked easily for pluralities into a multi-layered circuit board.

Other method of injecting has also been developed; namely, a substrate is provided using a half-cured thermosetting resin material, and a semiconductor chip is injected into it by raising the temperature of the substrate to be higher than the softening point. This method is suitable to the manufacture of such circuit boards which contain only a small number of components; for example, an IC card circuit board. However, for the manufacture of other types of circuit boards into which many electronic components are injected at different steps during the production, it seems difficult to use the method since it is difficult to provide appropriate processing conditions for each of the different process steps.

These conventional methods use a thermoplastic resin or a thermosetting resin for the material of the resin substrate. When a thermoplastic resin is used, it is easy to inject a semiconductor chip and an electronic component into the substrate. So, the methods are suitable to the manufacture of such cards as IC cards, memory cards, etc., where the cards are not supposed to undergo a high temperature treatment anymore after the injection of semiconductor chip is finished.

However, a thin and compact circuit board which contains many semiconductor devices and electronic components is requested to be free from thermal deformation due to thermal hysteresis during the manufacture and to insure a high level dimensional accuracy. In order to satisfy the above requirements, a thermoplastic resin of high softening point has to be selected. But, the use of such a material necessitates a high temperature and a strong pressure in injecting semiconductor chips or electronic components, which would inevitably endanger the product reliability.

DISCLOSURE OF THE INVENTION

The present invention addresses the above-described problems and aims to offer a solution. In the present invention, injection of a semiconductor chip and an electronic component into a resin substrate is conducted at a relatively low temperature, and then a heat withstanding property is given to the resin substrate. By so doing, a circuit board thus manufactured exhibits a suppressed rate of deformation rate and a high dimensional accuracy. A method for manufacturing the circuit boards is also disclosed.

A method for manufacturing a circuit board in accordance with the present invention comprises the softening by heat a resin substrate containing a thermoplastic component and a chemical cross-link component for injecting an electronic component having a protruding electrode into the resin substrate, curing the resin substrate by bridging the chemical cross-link component contained in the resin substrate, and forming an electrical wiring patterns on the surface of the resin substrate for connection with the protruding electrode. Namely, the resin substrate in the present invention features that it contains a thermoplastic component and a chemical cross-link component. At the injection of electronic component, the resin substrate can be softened at a relatively low temperature thanks to the thermoplastic component, facilitating an easy injection. After the injection, the chemical cross-link component is bridged to raise the heat-resisting characteristics of the circuit board. In this way, a circuit board having a suppressed rate of deformation, hence a high dimensional accuracy, is implemented in accordance with the present invention.

The process of injecting an electronic component into a resin substrate may comprise the disposing an electronic component on a resin substrate so that a surface of the electronic component that is opposite to the surface having the protruding electrode makes contact with the resin substrate, and softening with heat the resin substrate and then injecting with a pressure the electronic component into the softened resin substrate.

Instead, the process of injecting an electronic component into a resin substrate may comprise the disposing an electronic component so that the surface of the electronic component having the protruding electrode makes contact with the main surface of the resin substrate, and softening with heat the resin substrate and then injecting with a pressure the electronic component into the softened resin substrate; in which, the resin substrate is thinner than the overall thickness of the electronic component inclusive of the protruding electrode.

Thus, an electronic component can be injected into resin substrate by either one of the above-described methods, selected after taking the electronic component's overall shape, thickness, dispersion in the thickness values, etc. into consideration. After the injecting into resin substrate, the dimensional accuracy level of the circuit board can be raised by bridging the chemical cross-link component of the resin substrate for an improved heat-resisting characteristic. Furthermore, it broadens the freedom of choice on the production line. In the method where an electronic component is disposed so that the surface having protruding electrode makes contact to the main surface of resin substrate, the appearance of the protruding electrode out from the surface of resin substrate may ensured easily by making the resin substrate to be thinner than the electronic component inclusive of the protruding electrode. The above-described arrangement in the relative thickness between resin substrate and electronic component ensures that the protruding electrode appears without fail out of the surface of resin substrate. In general, it is preferred that the resin substrate and the electronic component are substantially identical to each other in the thickness; however, the resin substrate may be slightly thinner. But the resin substrate should preferably be thicker than the protruding electrode, because the resin substrate has to be thick enough to firmly hold and fix an injected electronic component. If the resin substrate is thin, an additional resin material may be applied and heat-pressed, until the injected electronic component is entirely embedded in resin substrate.

Instead, the process of injecting an electronic component into a resin substrate may comprise the provisional fixing of an electronic component on a provisional substrate so that a surface of the electronic component that is opposite to the surface having the protruding electrode makes contact with the provisional substrate, disposing a resin substrate on the provisional substrate which has the electronic component provisionally fixed thereon, softening by heat the resin substrate to have the electronic component injected into, and removing the provisional substrate after the injecting is finished. In the present process, the provisional substrate may be provided with convex portions of different thicknesses at the places on which the electronic components are to be disposed, the thicknesses of respective convex portions corresponding to the specific dimensions of respective electronic components. Use of the above-configured provisional substrate ensures that the electronic components are provisionally fixed with the top end of the protruding electrodes orientated on the same surface level.

Under the present method, all of the electronic components are once disposed at a higher positioning accuracy as compared to a method in which the electronic components are injected severally, and then they are injected. This contributes to eventually shorten the total process. In the method where the electronic components are disposed so that the surfaces of the electronic components those are opposite to the surface having the protruding electrodes make contact on a provisional substrate, the use of a provisional substrate which is provided with convex portions of different thicknesses for compensating the difference in the dimensions of respective electronic components contributes to the ease of putting the top faces of respective protruding electrodes on the same surface level. This ensures that the protruding electrodes of the electronic components appear without fail from the surface of resin substrate.

Or, the process of injecting an electronic component into a resin substrate may comprise instead the provisional fixing of an electronic component so that a surface of the electronic component that is opposite to the surface having the protruding electrodes makes contact with a provisional substrate, disposing a resin substrate on the provisional substrate having the electronic component provisionally fixed thereon, softening by heat the resin substrate and injecting the electronic component into the softened resin substrate with a pressure; and then the provisional substrate is removed after the electrical wiring patterns are formed. The provisional substrate can be retained through the whole production process, at least until the electrical wiring patterns are formed. Thus, the present method facilitates an easy handling of the circuit boards through the entire production processes; which naturally leads to an improved production yield rate.

Or, the process of injecting an electronic component into a resin substrate may comprise instead the provisional fixing of an electronic component so that the surface having the protruding electrodes makes contact with a provisional substrate, softening by heat the resin substrate and injecting the electronic component into the softened resin material with a pressure, and removing the provisional substrate; the resin substrate being thinner than the overall thickness of electronic component inclusive of the protruding electrodes. This method ensures that the protruding electrodes of the electronic component appear without fail from the surface of resin substrate. The above-described arrangement in the relative thickness ensures the exposure of the protruding electrodes from the surface of the resin substrate. In general, it is preferred that the resin substrate and the electronic component inclusive of the protruding electrodes have a substantially identical thickness, but the resin substrate may be slightly thinner. However, the resin substrate should preferably be thicker than the protruding electrode so that it can firmly hold and fix an electronic component. If it is not thick enough, additional resin material may be applied after the injection of the electronic component is finished, and heat-pressed likewise so that the electronic component is embedded entirely into resin substrate.

A method for manufacturing a circuit board in the present invention comprises softening by heat a resin substrate containing a thermoplastic component and a chemical cross-link component and injecting an electronic component having protruding electrodes into the softened resin substrate, forming electrical wiring patterns on the surface of the resin substrate for connection with the protruding electrodes of the electronic component, softening by heat the resin substrate and pressing the electrical wiring patterns and the electronic component in the resin substrate so that the electrical wiring patterns and the resin substrate share the same surface level, and bridging the chemical cross-link component in the resin substrate for curing.

With the present manufacturing method, the surface of electrical wiring patterns and the surface of resin substrate can be brought to substantially the same level. Also in this method, heat-resisting characteristics of a circuit board can be improved by bridging the chemical cross-link component in the resin substrate after the electrical wiring patterns are pressed into.

In a circuit board, the electronic component can be a semiconductor chip and the protruding electrodes can be bump electrodes. Furthermore, the electrical wiring patterns may be formed by printing a conductive material and hardening it. The circuit boards having built-in semiconductor chips can be manufactured at lower cost by taking advantage of these methods.

A material which has a melting point 50° C.-150° C. may be used for the thermoplastic component of resin substrate. The use of such a material lowers the heating temperature needed for injecting an electronic component into the substrate; so, even an electronic component vulnerable to high temperature can be incorporated in a circuit board.

A circuit board in the present invention comprises a heat-resisting substrate which includes a thermoplastic component and a chemical cross-link component and has been cured by bridging the chemical cross-link component, an electronic component having protruding electrodes injected in the heat-resisting substrate with at least the surface of protruding electrodes exposed from the substrate surface, and an electrical wiring patterns formed on the surface of the heat-resisting substrate for connection with the protruding electrodes of the electronic component. In such a configuration, an electronic component can be injected into the resin substrate at a relatively low temperature, but it eventually generates a finished circuit board which exhibits a high heat-resisting characteristic. Thus the present invention offers a circuit board which has a high operating reliability and a superior dimensional accuracy.

In the above-described circuit board, the surface of electrical wiring patterns may be brought to be on the same level as the surface of the heat-resisting substrate. This provides a flat-surfaced circuit board, which is an advantage for making a circuit board thinner and more compact.

DETAILED DESCRIPTION OF PREFERRED EMBODIMENTS

Figure 1A:
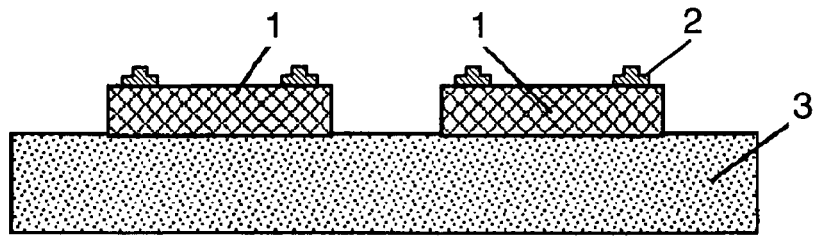
FIG. 1A through FIG. 1D show the cross sectional views used to describe a method of manufacturing a circuit board in accordance with a first embodiment of the present invention.

Exemplary embodiments of the present invention are described in detail referring to the drawings. Those identical elements are indicated by using respective symbols that are identical, and detailed description on them might be omitted.

First Exemplary Embodiment

FIG. 1A through FIG. 1D are cross sectional views used to describe a method for manufacturing a circuit board in accordance with a first embodiment of the present invention. As FIG. 1A shows, dispose electronic components 1 on the surface of resin substrate 3 which contains a thermoplastic component and a chemical cross-link component (hereinafter the substrate is referred to as resin substrate 3) so that the respective surfaces of electronic components 1 those are opposite to the surface having protruding electrodes 2 make contact with the main surface of the resin substrate. Since the semiconductor chip is used for electronic component 1 in the following description, semiconductor chip 1 should be interpreted as electronic component 1, and bump electrode 2 as protruding electrode 2.

Figure 1B:
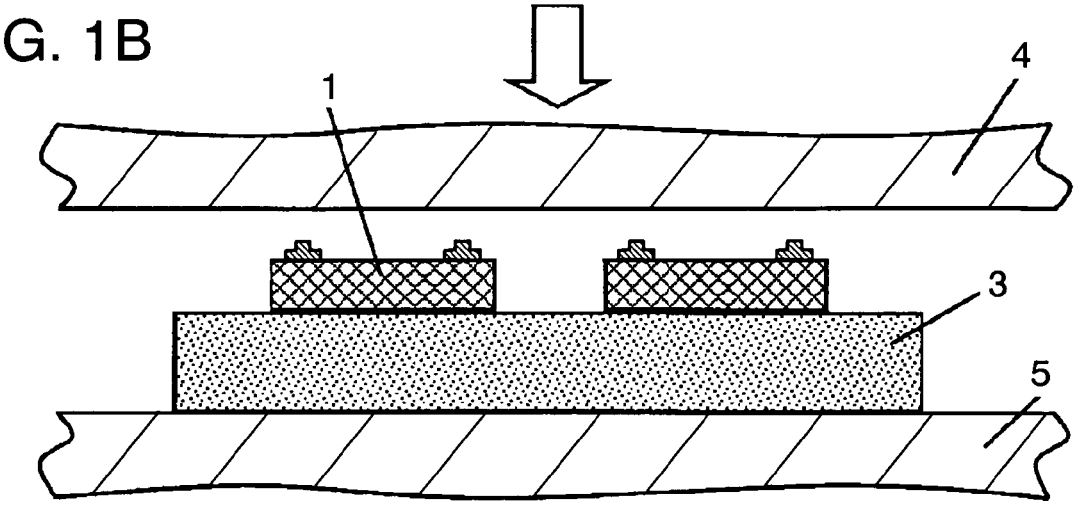

Then as FIG. 1B shows, load resin substrate 3 and semiconductor chips 1 together on a heat-pressing equipment which is provided with a pair of heat press plates 4 and 5, to have semiconductor chips 1 injected into resin substrate 3 with a heat and a pressure. Instead, dispose semiconductor chips 1 on the surface of resin substrate 3 which has been fixed in advance on one of the pair of heat press plates 4, 5; to have them heated and pressed between the heat press plates.

Figure 1C:
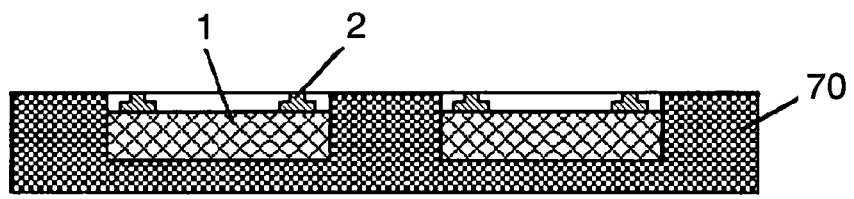
Figure 1D:
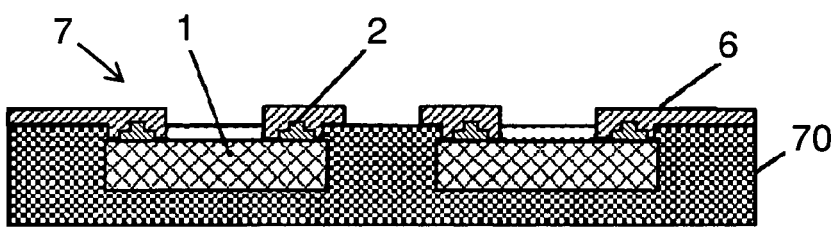

Next, as FIG. 1C shows, unload resin substrate 3 embedded with semiconductor chips 1 from the heat-press equipment, to have it cured by bridging the chemical cross-link component contained in resin substrate 3. The chemical cross-linking reaction can be caused by, for example, Ultra Violet (UV) radiation, Electron beam (EB) radiation, or an integration with heat. Since it remarkably improves the heat-resisting characteristic, resin substrate 3 becomes heat-withstanding substrate 70. And then, form electrical wiring patterns 6 on heat-withstanding substrate 70 for connection with bump electrodes 2, respectively. Electrical wiring patterns 6 can be provided by, for example, screen-printing a conductive paste and hardening it. The formation of electrical wiring patterns completes finished circuit board 7; in which, semiconductor chips 1 have been embedded in heat-withstanding substrate 70 while electrical wiring patterns 6 have been formed on the surface.

At the injecting step shown in FIG. 1B, an intermediary member, such as a fluorinated resin sheet, may be provided between the upper heat press plate 4 and semiconductor chips 1. This is effective to prevent semiconductor chips 1 from sticking with the upper heat press plate 4; which makes a separating operation easier. The use of such intermediary member is likewise effective also in the following embodiments.

Second Exemplary Embodiment

FIG. 2A through FIG. 2D are cross sectional views used to describe a method for manufacturing a circuit board in accordance with a second embodiment of the present invention. A method for manufacturing a circuit board in the present embodiment includes a process of disposing semiconductor chips 1 on resin substrate 8 so that bump electrodes 2 faces to the main surface of the resin substrate, and injecting the semiconductor chip into the resin substrate.

Figure 2A:
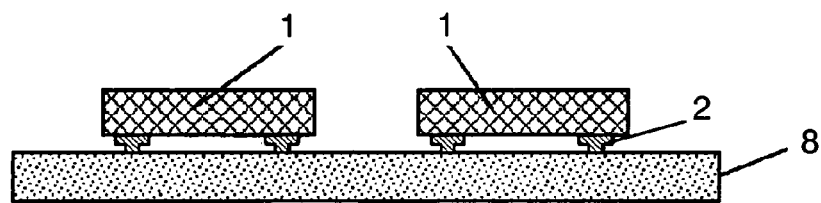
FIG. 2A through FIG. 2D show the cross sectional views used to describe a method of manufacturing a circuit board in accordance with a second embodiment of the present invention.

As FIG. 2A shows, dispose semiconductor chips 1 on resin substrate 8 which contains a thermoplastic component and a chemical cross-link component (hereinafter referred to as resin substrate 8) so that bump electrodes 2 face to the main surface of the resin substrate.

Figure 2B:
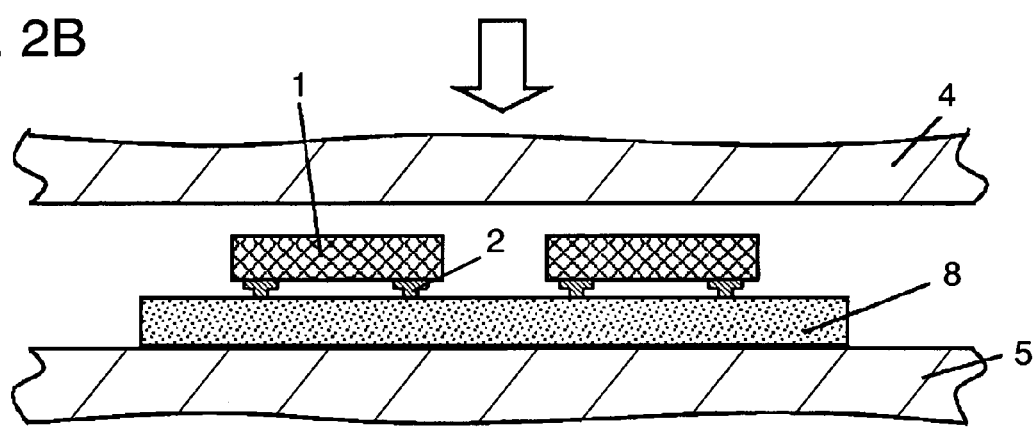
Figure 2C:
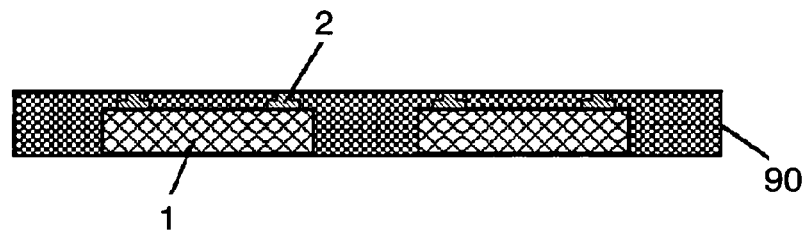

Then as FIG. 2B shows, load resin substrate 8 on a heat-pressing equipment which is provided with a pair of heat press plates 4 and 5 to have semiconductor chips 1 injected into resin substrate 8 by a heat and pressure. Unload resin substrate 8 which is embedded with semiconductor chips 1 from the equipment, and bridge the chemical cross-link component of resin substrate 8 for curing, ref. FIG. 2C. Like in the first embodiment, resin substrate 8 is provided with an improved heat-resisting characteristic, and becomes heat-withstanding substrate 90.

Figure 2D:
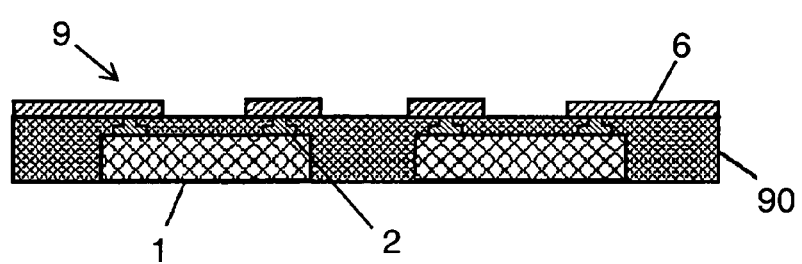

As FIG. 2D shows, provide electrical wiring patterns 6 on heat-withstanding substrate 90 for connection with bump electrodes 2, respectively. Electrical wiring patterns 6 can be formed by, for example, screen-printing a conductive paste and hardening it. This completes finished circuit board 9; in which, semiconductor chips 1 have been injected in heat-withstanding substrate 90 while electrical wiring patterns 6 on the surface.

In the injecting step as shown in FIG. 2B, an intermediary member of fluorinated resin may be provided between heat press plate 4 and semiconductor chips 1, for the same purpose as described in the first embodiment. A fluorinated resin sheet, for example, may be used for the intermediary member. This is effective to prevent semiconductor chips 1 from sticking with the upper heat press plate 4; which makes a separating operation easier.

Resin substrate 8 in the present embodiment has a substantially identical thickness as the electronic component 1 inclusive of the protruding electrodes 2. However, it is not the intension of the present invention to limit the thickness as such; the resin substrate may be slightly thinner. Resin substrate 8 should preferably be thicker than the protruding electrodes 2 so that it can firmly hold and fix electronic components 1. If it is not thick enough, additional resin material of the same composition may be applied after electronic components 1 are injected. Once again, heat and press it likewise so that electronic components 1 are embedded entirely in the resin substrate.

In the first and second embodiments, those materials which can be used for the thermoplastic component of resin substrate include polyester, polyolefin, polycarbonate, ABS, polymer alloy, etc.; those which can be used for the chemical cross-link component include those which contain vinyl group, isocyanato group, blocked isocyanato, glycidyl group, carvoxylate group, etc. in the skeletal structure. For curing the chemical cross-link component, an appropriate means may be selected from among UV radiation, heat treatment, etc. depending on a chemical cross-link component contained.

In the first and second embodiments, the electrical wiring patterns are formed after the chemical cross-link component is bridged, and the resin substrate is provided with an improved heat-resisting characteristic. By so doing, the dimensional accuracy of resin substrate is not ill-affected by the heat applied during printing and hardening of a conductive material. However, in a case where, for example, the photo-curing, EB curing, etc. is used for the formation of the electrical wiring patterns, the bridging of chemical cross-link component for curing may be conducted after the electrical wiring patterns are formed.

Although a semiconductor chip has been used for the electronic component in the first and second embodiments, it is not the intension of the present invention to limit the electronic component to a semiconductor chip. Namely, other type electronic components such as a resistor, a capacitor, various kinds of sensors can be injected and embedded likewise in a circuit board, in so far as each of them has an electrode protruding from the surface.

Third Exemplary Embodiment

Figure 3A:
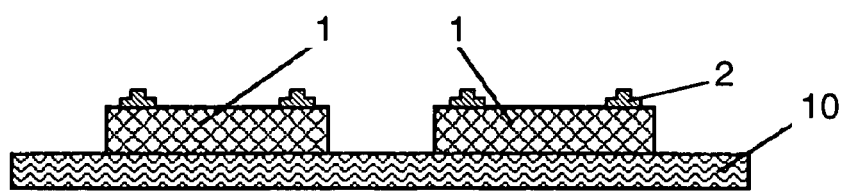
FIG. 3A through FIG. 3D show the cross sectional views used to describe a method of manufacturing a circuit board in accordance with a third embodiment of the present invention.

FIG. 3A through FIG. 3D are cross sectional views used to describe a method for manufacturing a circuit board in accordance with a third embodiment of the present invention. As FIG. 3A shows, place and fix semiconductor chips 1 on provisional substrate 10 at certain specified locations so that the surfaces of the semiconductor chips those are opposite to the surfaces having bump electrodes 2 make contact with the main surface of the provisional substrate, respectively. Semiconductor chips 1 can be fixed on the provisional substrate by, for example, applying an adhesive agent on the chip surfaces. If an adhesive agent used is of a character which loses its stickiness by a heat given during a heat-pressing treatment, it is easy to separate semiconductor chips 1 from provisional substrate 10 immediately after the injection. Although FIG. 3A describes semiconductor chip 1 for two pieces, it can be disposed for more numbers, even in a mixture with other type electronic components.

Figure 3B:
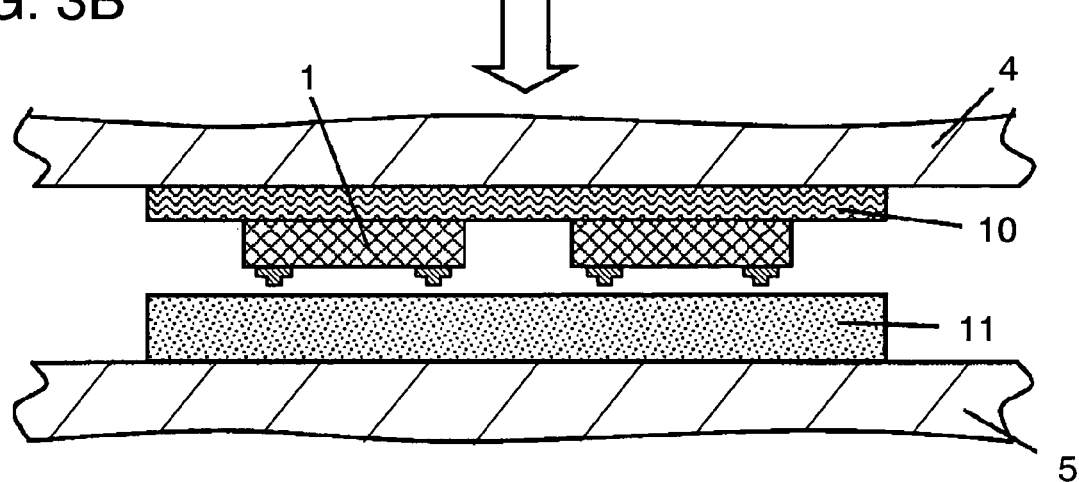

As FIG. 3B shows, load resin substrate 11 which contains a thermoplastic component and a chemical cross-link component (hereinafter referred to as resin substrate 11) and provisional substrate 10 having semiconductor chips 1 provisionally fixed thereon together on a heat-pressing equipment which is provided with a pair of heat press plates 4 and 5. Provisional substrate 10 is disposed so that the bump electrodes 2 of the semiconductor chips 2 oppose to resin substrate 11. Heat and press them together by means of the pair of heat press plates 4 and 5, and semiconductor chips 1 are injected into resin substrate 11. And then, unloaded it from the heat-pressing equipment, and remove provisional substrate 10.

Figure 3C:
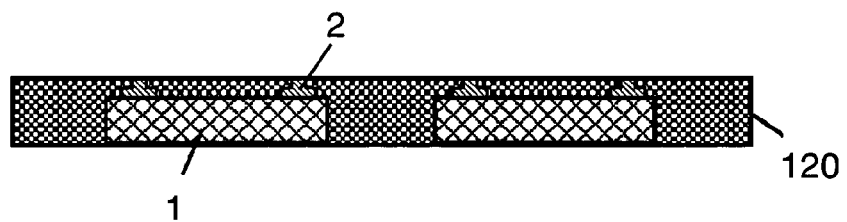
Figure 3D:
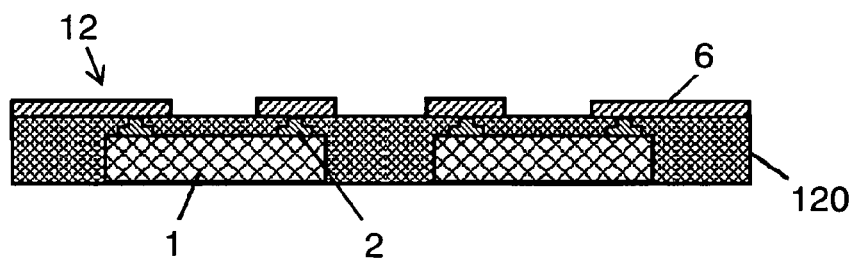

After provisional substrate 10 is removed, bridge the chemical cross-link component of resin substrate 11 for curing, ref. FIG. 3C. Then, resin substrate 11 becomes heat-withstanding substrate 120. As FIG. 3D shows, provide electrical wiring patterns 6 on heat-withstanding substrate 120 for connection with bump electrodes 2, respectively. Electrical wiring patterns 6 may be formed by, for example, screen-printing a conductive paste and hardening it. This completes finished circuit board 12; in which, semiconductor chips 1 have been injected in heat-withstanding substrate 120 while electrical wiring patterns 6 have been formed on the surface.

Since provisional substrate 10 in the present embodiment provisionally fixes semiconductor chips 1 at certain specified locations respectively, the semiconductor chips are hardly dislocated during the heat-pressing procedure. Thus semiconductor chips 1 can be injected and embedded precisely at a desired place. Consequently, electrical wiring patterns 6 for connection with bump electrodes 2 respectively can be provided in fine patterns. Furthermore, depending on a means employed for fixing the semiconductor chips on provisional substrate 10, the work in process can be unloaded from a heat-pressing equipment before it is completely cooled down. It may be cooled thoroughly at somewhere outside of the heat-pressing equipment. By so arranging the flow of manufacturing, it will be possible to make the total production time shorter.

Although resin substrate 11 in the present embodiment is described to have substantially the same thickness as electronic component 1 inclusive of protruding electrodes 2, it is not the intension of the present invention to limit the relative thickness as such. Resin substrate 11 may be thinner. In this case, the resin substrate 11 is expected to be thicker than at least the thickness of protruding electrodes 2, to be thick enough to fix injected electronic component 1. After electronic component 1 is injected, apply an additional resin material of the same composition, and heat and press it once again so that electronic component 1 is embedded in the resin substrate.

In a case where the electronic components of different thicknesses are injected, it is recommendable to provide provisional substrate 10 with the convex portions of different thicknesses (not shown) for compensating the thickness differences with respective electronic components. Such the convex portions may be formed either by machine treating provisional substrate 10, or applying another material on provisional substrate 10. The use of such a provisional substrate facilitates to have the top parts of protruding electrodes exposed on the same surface level even when a plurality of electronic components each having different thickness of its own are involved. This eases restrictions existed when many electronic components are injected simultaneously at a single operation step; so, varieties of different electronic components can be injected and embedded at a single process step.

Fourth Exemplary Embodiment

Figure 4A:
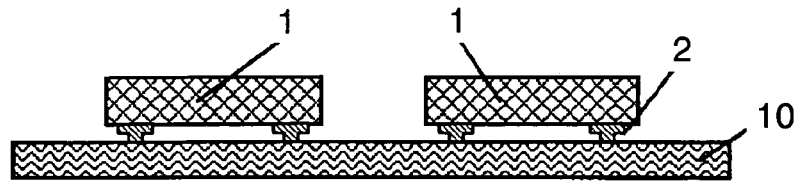
FIG. 4A through FIG. 4D show the cross sectional views used to describe a method of manufacturing a circuit board in accordance with a fourth embodiment of the present invention.

FIG. 4A through FIG. 4D are cross sectional views used to describe a method for manufacturing a circuit board in accordance with a fourth embodiment of the present invention. As FIG. 4A shows, fix semiconductor chips 1 on provisional substrate 10 at the certain specified locations so that the surfaces of semiconductor chips 1 having bump electrodes 2 face to the main surface of provisional substrate 10, respectively. It may be fixed by means of an adhesive agent, in the same way as in the third embodiment. Although FIG. 4A shows semiconductor chip 1 for two pieces, it may be disposed for more numbers or in a mixture with other electronic components such as resistor, capacitor, etc.

Figure 4B:
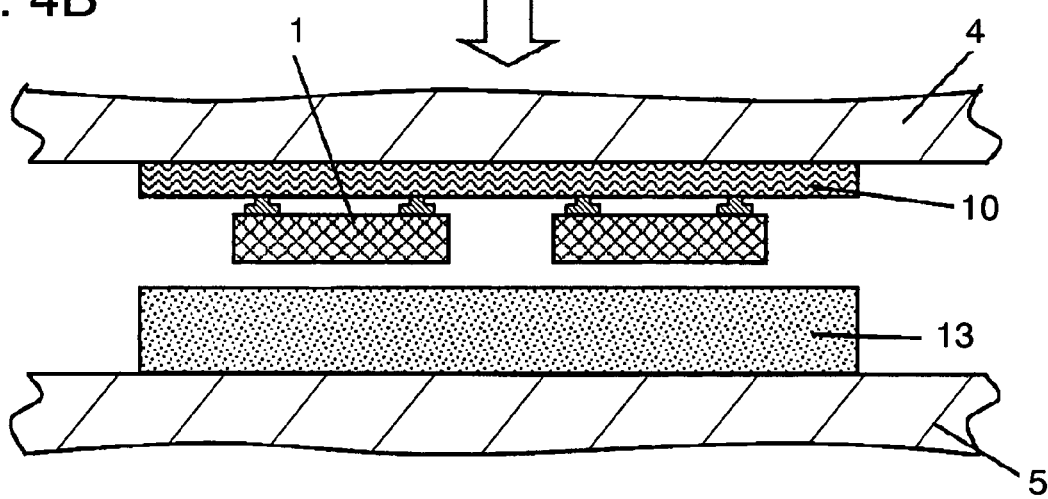

As FIG. 4B shows, load resin substrate 13 which contains a thermoplastic component and a chemical cross-link component (hereinafter referred to as resin substrate 13) on the lower heat press plate 5 of a heat-pressing equipment, and load provisional substrate 10 which has semiconductor chips 1 fixed thereto on the upper heat press plate 4 so that the semiconductor chips face to the resin substrate. Heat press plates 4 and 5 press these together by a heat and pressure, to have semiconductor chips 1 injected into resin substrate 13. After they are cooled, unload them from the heat-pressing equipment, and remove provisional substrate 10. Instead of loading provisional substrate 10 mounted with semiconductor chips 1 on heat press plate 4, these substrate and semiconductor chips may be disposed on resin substrate 13 to be press-heated between heat press plates 4 and 5.

Figure 4C:
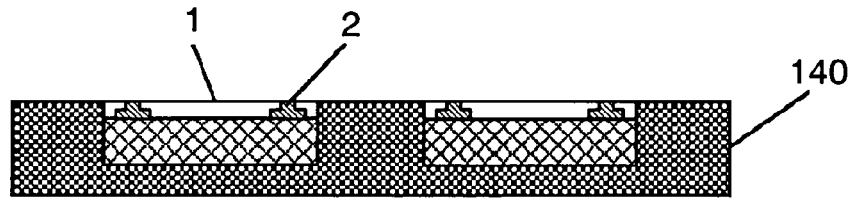

As FIG. 4C shows, bridge the chemical cross-link component of resin substrate 13 for curing. This provides resin substrate 13 with an improved heat-resisting characteristic, and it becomes heat-withstanding substrate 140.

Figure 4D:
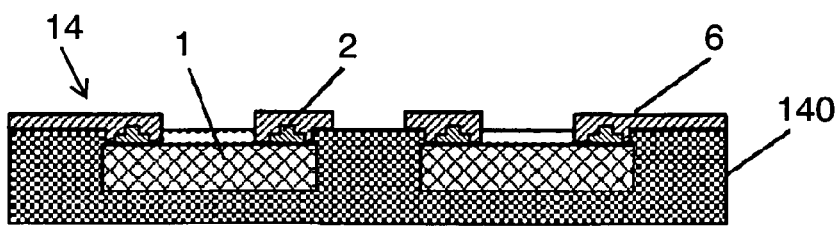

As FIG. 4D shows, provide electrical wiring patterns 6 on heat-withstanding substrate 140 for connection with bump electrode 2, respectively. Electrical wiring patterns 6 may be formed by, for example, screen-printing a conductive paste and hardening it. This completes finished circuit board 14; in which, semiconductor chips 1 have been injected in heat-withstanding substrate 140, while electrical wiring patterns 6 on the surface.

Since semiconductor chips 1 in the present embodiment are provisionally fixed on provisional substrate 10, like in the third embodiment, they are hardly displaced during the heat-pressing procedure. Thus semiconductor chips 1 can be injected and embedded into the resin substrate precisely at the certain specific locations, respectively. Consequently, electrical wiring patterns 6 for connection with bump electrodes 2 respectively can be provided in fine patterns. Furthermore, depending on a means used for fixing the semiconductor chips on provisional substrate 10, the work in process can be unloaded from a heat-pressing equipment before it is completely cooled down. It may be thoroughly cooled at somewhere outside of the heat-pressing equipment. By so arranging the flow of manufacturing, it will contribute to make the total production time shorter.

As understood from the illustration in FIG. 4A through FIG. 4D, in the method where semiconductor chips 1 are provisionally fixed on provisional substrate 10 so that bump electrodes 2 make contact to provisional substrate 10, there is no need of providing provisional substrate 10 with certain specific convex portions of different thicknesses even if a plurality of electronic components each having its own thickness is involved.

In the third and fourth embodiments, those materials such as polyester, polyolefin, polycarbonate, ABS, polymer alloy, etc. may be used for the thermoplastic component of resin substrate; while those which contain vinyl group, isocyanato group, blocked isocyanato, glycidyl group, carvoxylate group, etc. in the skeletal structure may be used for the chemical cross-link component.

Furthermore, in the third and fourth embodiments, the electrical wiring patterns are provided after the chemical cross-link component of resin substrate is bridged for curing. By so doing, the dimensional accuracy of the substrate is hardly ill-affected by the heat given during printing and hardening of a conductive material. However, in a case where the electrical wiring patterns are formed using, for example, photo-curing, EB curing, etc., the chemical cross-link component may be bridged after the electrical wiring patterns is formed.

Although a semiconductor chip has been used for the electronic component in the third and fourth embodiments, it is not the intension of the present invention to limit the electronic component to a semiconductor chip. Namely, other type electronic components such as a resistor, a capacitor, various kinds of sensors can be injected and embedded likewise in a circuit board, in so far as each of them is provided with some electrodes protruding from the surface.

Fifth Exemplary Embodiment

Figure 5A:
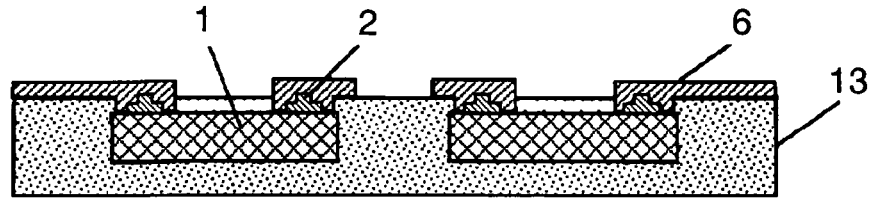
FIG. 5A through FIG. 5D show the cross sectional views used to describe a method of manufacturing a circuit board in accordance with a fifth embodiment of the present invention.

FIG. 5A through FIG. 5D are cross sectional views used to describe a method for manufacturing a circuit board in accordance with a fifth embodiment of the present invention. FIG. 5A shows a state when semiconductor chips 1 have been injected into resin substrate 13 in accordance with the method of the first embodiment, and electrical wiring patterns 6 have been provided, prior to bridging of the chemical cross-link component contained in resin substrate 13. Namely, when semiconductor chips 1 are injected in resin substrate 13 and cooled, resin substrate 13 gets hard. And then, electrical wiring patterns 6 are provided by, for example, screen-printing a conductive material, and hardening it. At this stage, electrical wiring patterns 6 are pushing out of the surface of resin substrate 13.

Figure 5B:
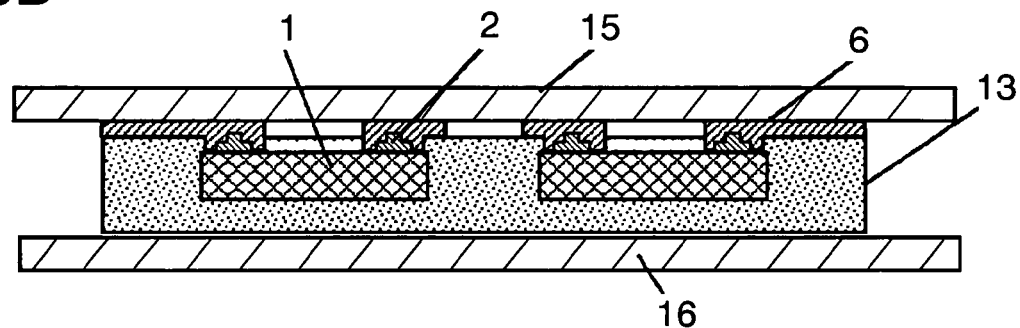
Figure 5C:
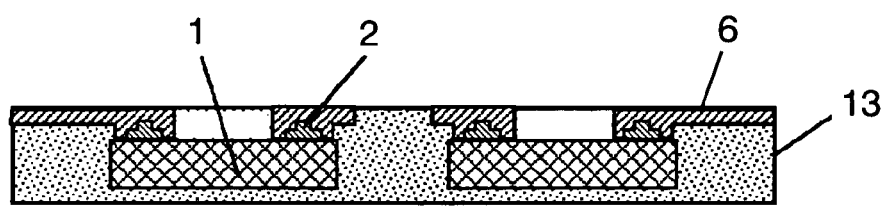

As FIG. 5B shows, load the above resin substrate 13 having electrical wiring patterns 6 on a heat-pressing equipment which is provided with a pair of heat press plates 15 and 16, to have the resin substrate heated and pressed. FIG. 5C shows the resultant state; where both semiconductor chips 1 and electrical wiring patterns 6 are embedded in resin substrate 13.

Figure 5D:
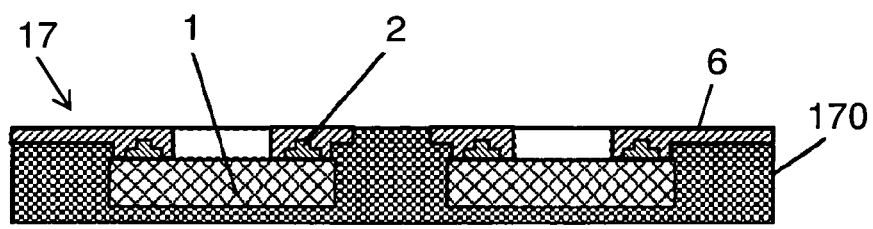
Figure 6A:
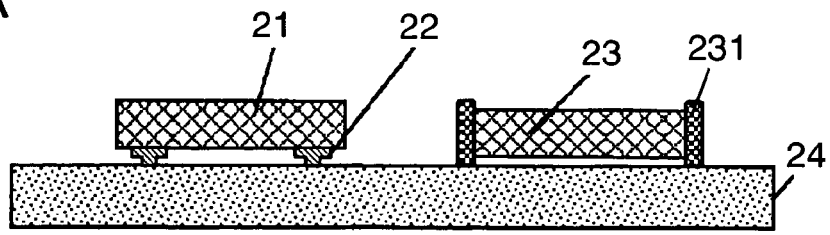
FIG. 6A through FIG. 6D show the cross sectional views used to describe a conventional method of manufacturing a circuit board.
Figure 6B:
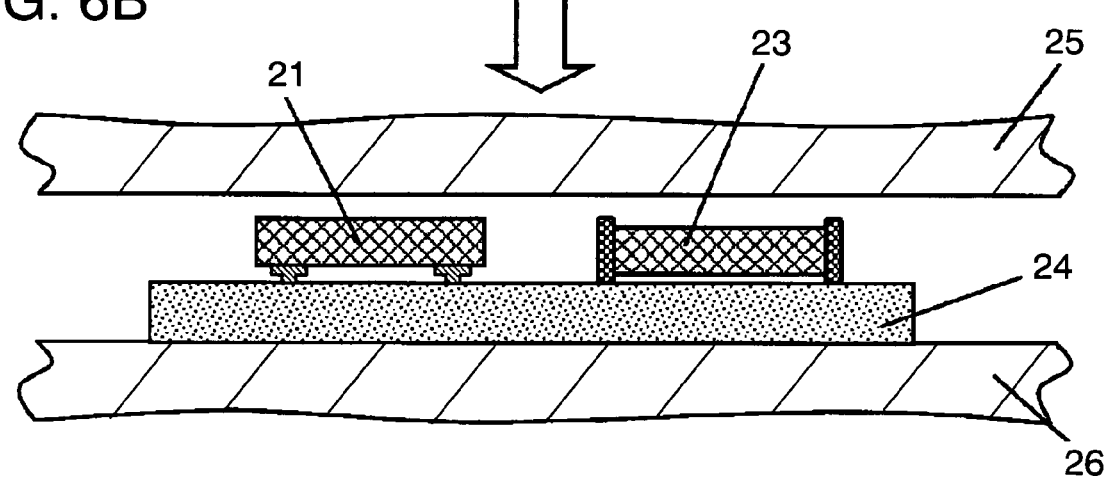
Figure 6C:
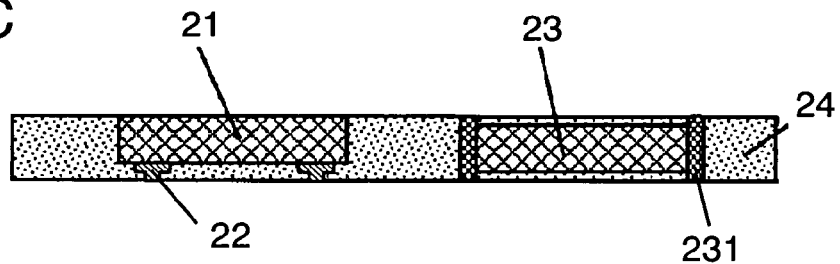
Figure 6D:
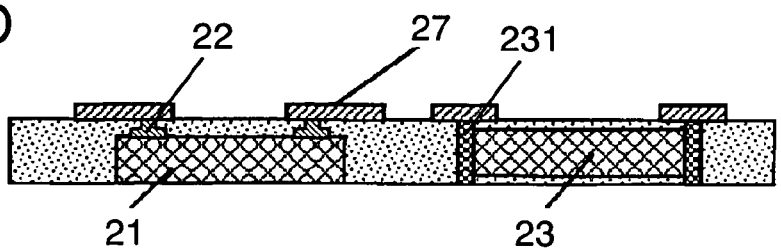
Figure 7A:
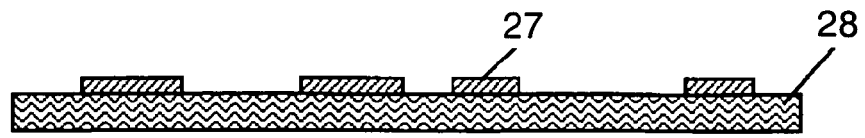
FIG. 7A through FIG. 7E show the cross sectional views used to describe other conventional method of manufacturing a circuit board.
Figure 7B:
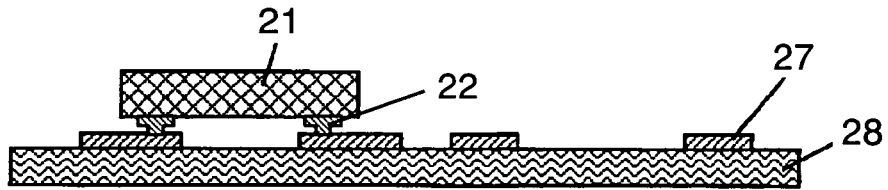
Figure 7C:
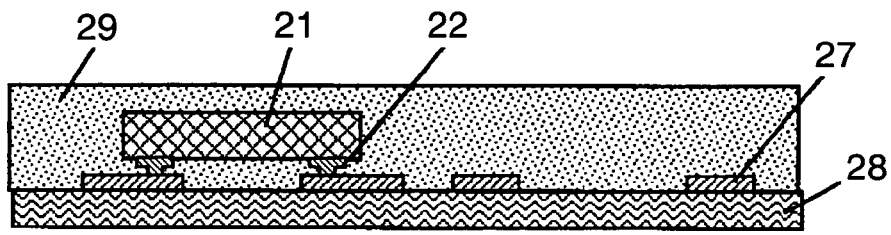
Figure 7D:
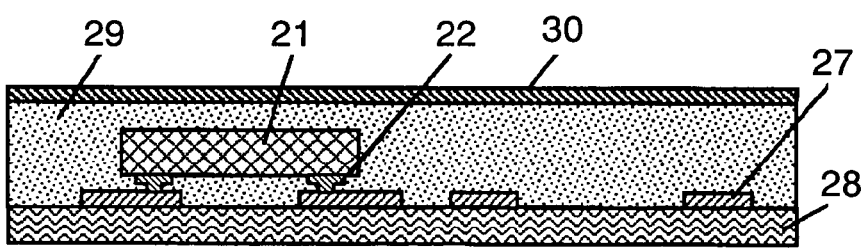
Figure 7E:
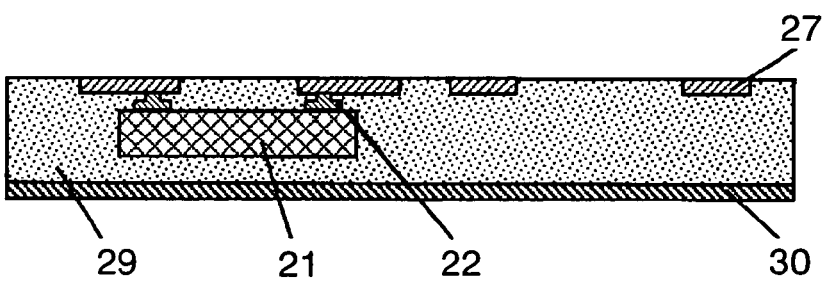

And then, bridge the chemical cross-link component of resin substrate 13 for curing. Resin substrate 13 is provided with an improved heat-resisting characteristic, and becomes heat-withstanding substrate 170, ref. FIG. 5D. If the chemical cross-link component is bridged after electrical wiring patterns 6 are embedded in resin substrate 13, it not only improves the heat-resisting characteristic but it also makes the surface of circuit board 17 flat. The flat circuit boards can be easily stacked into a circuit board of multi-layered structure.

Sample boards manufactured in accordance with the present embodiment were measured with respect to the rate of deformation due to high temperature. Table 1 shows the results of measurement. The rate of deformation of a resin substrate, or film, is represented by a ratio of distance between certain specific two points predetermined on a resin substrate at normal room temperature versus that at respective temperatures measured. The lower deformation rate signifies the higher heat-withstanding characteristic. Operation characteristics of semiconductor chips was also appraised after it is injected and embedded in resin substrate with a heat and pressure and then the resin substrate is restored to the normal room temperature. The resin substrate measured 0.1 mm thick, the semiconductor chip measured 5 mm×5 mm×0.1 mm.

Referring to Table 1, Sample 1 has a resin substrate of olefin resin which contains in part a grafted segment of alkoxysilane used as functional group. Semiconductor chips were injected into the substrate at 160° C., pressure 350N.

Sample 2 has a resin substrate of olefin resin which contains in part a grafted segment of carboxylic acid group or hydroxyl group used as functional group. Semiconductor chips were injected into it at 160° C., pressure 350N.

TABLE 1

| Sample No. | Resin Substrate Deformation Rate (%, No load) | | | | | Chip Operation | Chemical cross-link |
| --- | --- | --- | --- | --- | --- | --- | --- |
|  | 50° C. | 100° C. | 120° C. | 150° C. | 190° C. |  |  |
| Sample 1 | 0.011 | 0.013 | 0.015 | 0.022 | 0.030 | Normal | Alkoxysilane |
| Sample 2 | 0.055 | 0.077 | 0.100 | 0.250 | 0.400 | Normal | Ester |
| Comparison 1 | 2.000 | 4.000 | 5.000 | 7.000 | 8.000 | Normal | Polyethylene (non c-link) |
| Comparison 2 | 0.010 | 0.018 | 0.021 | 0.250 | 0.500 | Normal | PET (non c-link) |
| Comparison 3 | 0.010 | 0.011 | 0.019 | 0.013 | 0.019 | Un-injectable | Polyimide |

Comparison sample 1 has a resin substrate of polyethylene film, in which semiconductor chips were injected at 160° C., pressure 350N. Comparison sample 2 has a resin substrate of polyethylene terephthalate (PET), in which semiconductor chips were injected at 160° C., pressure 350N. Comparison sample 3 has a resin substrate of polyimide film. Since the film is not thermoplastic, semiconductor chips can not be injected into; but it was measured as the one having a low thermal deformation rate.

From Table 1, it has been confirmed that Sample 1, whose substrate is olefin resin having in part a grafted segment of alkoxysilane used as functional group and provided with an improved heat-resisting property through the reaction of alkoxysilane cross-link, exhibits a superior heat-resisting characteristic as compared to PET resin substrate of Comparison sample 2.

Sample 2, whose substrate is olefin resin having in part a grafted segment of carboxylic acid group or hydroxyl group used as functional group, exhibits a greater deformation rate as compared to that of Sample 1. However, it was also found out that it serves satisfactorily in the normal practical environment, or a temperature 150° C. or lower.

In the present embodiment, those materials such as polyester, polyolefin, polycarbonate, ABS, polymer alloy, etc. may be used for the thermoplastic component of resin substrate; while those which contain vinyl group, isocyanato group, blocked isocyanato, glycidyl group, carvoxylate group, etc. in the skeletal structure may be used for the chemical cross-link component.

Although a semiconductor chip has been used for the electronic component in the present embodiment, it is not the intension of the present invention to limit the electronic component to a semiconductor chip. Namely, other type electronic components such as a resistor, a capacitor, various types of sensors can be injected and embedded likewise in a circuit board in so far as each of them is provided with some electrodes protruding from the surface.

In the first through fifth embodiments, a plurality of semiconductor chips or electronic components are heat-pressed simultaneously at a single process step. However, it is not the intension of the present invention to limit the method to the simultaneous processing of a plurality of components. Instead, the electronic components may be injected piece after piece, and the chemical cross-link component may be bridged for an improved heat-withstanding characteristic after the injection of all the electronic components is finished.

INDUSTRIAL APPLICABILITY

The resin substrate in the present invention includes a thermoplastic component and a chemical cross-link component. During the process of injecting an electronic component into the resin substrate, the property of thermoplastic component is dominating; so, an electronic component can be injected in the resin substrate at a relatively low temperature. After the injecting operation is finished, the chemical cross-link component is bridged for generating an improved heat-resisting characteristic. Circuit boards manufactured in accordance with the present invention exhibit only a limited dispersion in the values of substrate dimensions and a low rate in the thermal deformation. Thus the present invention seems to offer a certain advantage in the sector of thin-and-compact circuit boards; the demand for such circuit boards is growing significantly for use in the compact portable electronic equipment.

The invention claimed is:

1. A method for manufacturing a circuit board comprising:
softening with heat a resin substrate which contains a thermoplastic component and a chemical cross-link component and injecting an electronic component having a protruding electrode into the resin substrate;
curing the resin substrate by bridging the chemical cross-link component contained in the resin substrate; and
forming an electrical wiring pattern on a surface of the resin substrate for connection with the protruding electrode of the electronic component.

2. The method of manufacturing a circuit board according to claim 1, wherein the injecting of the electronic component into the resin substrate comprises:
disposing the electronic component on the resin substrate so that a surface of the electronic component that is opposite to a surface having the protruding electrode contacts the resin substrate; and
softening with heat the resin substrate and injecting the electronic component into the resin substrate.

3. The method of manufacturing a circuit board according to claim 1, wherein the injecting of the electronic component into the resin substrate comprises:
disposing the electronic component on the resin substrate so that a surface of the electronic component having the protruding electrode contacts a main surface of the resin substrate; and
softening with heat the resin substrate and injecting the electronic component into the resin substrate; wherein the resin substrate is thinner than the electronic component inclusive of the protruding electrode.

4. The method of manufacturing a circuit board according to claim 1, wherein the injecting of the electronic component into the resin substrate comprises:
provisionally fixing an electronic component so that a surface of the electronic component that is opposite to a surface having the protruding electrode sticks to a provisional substrate;
disposing the resin substrate on the provisional substrate having the electronic component provisionally fixed thereon;
softening with heat the resin substrate and injecting the electronic component into the resin substrate; and
removing the provisional substrate after the injecting operation is finished.

5. The method of manufacturing a circuit board according to claim 4, wherein
the provisional substrate is provided at specific places for provisionally fixing plural electronic components with certain specific convex portions of pertinent thicknesses corresponding to proprietary thicknesses of the electronic components, respectively, so that the top ends of the protruding electrodes of the provisionally fixed electronic components are orientated to be on the same surface level.

6. The method of manufacturing a circuit board according to claim 1, wherein the injecting of the electronic component into the resin substrate comprises:
provisionally fixing the electronic component so that a surface of the electronic component that is opposite to a surface having the protruding electrode sticks to a provisional substrate;
disposing the resin substrate on the provisional substrate having the electronic component provisionally fixed thereon; and
softening with heat the resin substrate and injecting the electronic component into the resin substrate; wherein the provisional substrate is removed after the electrical wiring pattern is formed.

7. The method of manufacturing a circuit board according to claim 1, wherein the injecting of the electronic component into the resin substrate comprises:
provisionally fixing the electronic component so that a surface of electronic component having the protruding electrode sticks to a provisional substrate;
softening with heat the resin substrate and injecting the electronic component into the resin substrate; and
removing the provisional substrate; wherein
the resin substrate is thinner than that of the electronic component inclusive of the protruding electrode.

8. The method of manufacturing a circuit board according to claim 1, wherein
the electronic component is a semiconductor chip, and the protruding electrode is a bump electrode.

9. The method of manufacturing a circuit board according to claim 1, wherein
the electrical wiring pattern is provided by printing and hardening a conductive material.

10. The method of manufacturing a circuit board according to claim 1, wherein
the thermoplastic component has a melting point of 50° C.-150° C.

11. A method for manufacturing a circuit board comprising:
softening with heat a resin substrate which contains a thermoplastic component and a chemical cross-link component and injecting an electronic component having a protruding electrode into the resin substrate;
forming an electrical wiring pattern on a surface of the resin substrate for connection with the protruding electrode of the electronic component;

softening with heat the resin substrate and pressing the electrical wiring pattern and the electronic component into the resin substrate so that the electrical wiring pattern and the resin substrate share the same surface level; and bridging the chemical cross-link component contained in the resin substrate for curing.

12. The method of manufacturing a circuit board according to claim 11, wherein
the electronic component is a semiconductor chip, and the protruding electrodes are bump electrodes.

13. The method of manufacturing a circuit board according to claim 11, wherein
the electrical wiring patterns are provided by printing and hardening a conductive material.

14. The method of manufacturing a circuit board according to claim 11, wherein
the thermoplastic component has a melting point of 50° C.-150° C.

15. A circuit board comprising:
a heat-withstanding substrate containing a thermoplastic component and a chemical cross-link component, which substrate has been cured by bridging the chemical cross-link component;

an electronic component provided with a protruding electrode, which electric component has been injected into the heat-withstanding substrate so that at least a top face of the protruding electrode is exposed from a surface of the heat-withstanding substrate, and an electrical wiring pattern formed on the surface of the heat-withstanding substrate for connection with the protruding electrode of the electronic component.

16. The circuit board according to claim 15, wherein
a surface of the electrical wiring pattern and the surface of the heat-withstanding substrate share the same surface level.

* * * * *